United States Patent
Adetutu et al.

(10) Patent No.: US 8,426,310 B2
(45) Date of Patent: Apr. 23, 2013

(54) METHOD OF FORMING A SHARED CONTACT IN A SEMICONDUCTOR DEVICE

(75) Inventors: Olubunmi O. Adetutu, Austin, TX (US); Ted R. White, Austin, TX (US); Mark D. Hall, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 307 days.

(21) Appl. No.: 12/787,296

(22) Filed: May 25, 2010

(65) Prior Publication Data

US 2011/0294292 A1    Dec. 1, 2011

(51) Int. Cl.
*H01L 21/44* (2006.01)

(52) U.S. Cl.
USPC ................ 438/675; 257/E21.584

(58) Field of Classification Search .......... 438/675; 257/E21.584
See application file for complete search history.

(56) References Cited

U.S. PATENT DOCUMENTS

| | | | |
|---|---|---|---|
| 5,824,579 A * | 10/1998 | Subramanian et al. | 438/238 |
| 6,100,569 A | 8/2000 | Yeh | |
| 6,245,621 B1 * | 6/2001 | Hirohama | 438/303 |
| 6,512,299 B1 * | 1/2003 | Noda | 257/774 |
| 6,724,085 B2 * | 4/2004 | Tomita | 257/758 |
| 6,927,461 B2 | 8/2005 | Kim et al. | |
| 2002/0024105 A1 * | 2/2002 | Ishida | 257/390 |
| 2002/0117722 A1 * | 8/2002 | Osada et al. | 257/379 |
| 2003/0107133 A1 * | 6/2003 | Tomita | 257/758 |
| 2007/0023832 A1 * | 2/2007 | Matsui | 257/344 |
| 2007/0210339 A1 * | 9/2007 | Narasimhan et al. | 257/213 |
| 2008/0203450 A1 * | 8/2008 | Naruse et al. | 257/290 |
| 2008/0230917 A1 * | 9/2008 | Chou et al. | 257/774 |
| 2009/0283921 A1 * | 11/2009 | Wang | 257/786 |
| 2010/0258873 A1 * | 10/2010 | Harashima et al. | 257/368 |

* cited by examiner

*Primary Examiner* — Robert J Hoffberg
*Assistant Examiner* — Igwe U Anya
(74) *Attorney, Agent, or Firm* — James L. Clingan, Jr.; Jonathan N. Geld (57) ABSTRACT

A method for forming a shared contact in a semiconductor device having a gate electrode corresponding to a first transistor and a source/drain region corresponding to a second transistor is provided. The method includes forming a first opening in a dielectric layer overlying the gate electrode and the source/drain region, wherein the first opening extends substantially to the gate electrode corresponding to the first transistor. The method further includes after forming the first opening, forming a second opening, contiguous with the first opening, in the overlying dielectric layer, wherein the second opening extends substantially to the source/drain region corresponding to the second transistor. The method further includes forming the shared contact between the gate electrode corresponding to the first transistor and the source/drain region corresponding to the second transistor by filling the first opening and the second opening with a conductive material.

20 Claims, 14 Drawing Sheets

METHOD OF FORMING A SHARED CONTACT IN A SEMICONDUCTOR DEVICE

BACKGROUND

1. Field

This disclosure relates generally to contacts in a semiconductor device, and more specifically, to shared contacts in a semiconductor device.

2. Related Art

In semiconductor manufacturing, one of the most important factors for success is having good yield. Thus there is a continuous effort to make yields better in the face of continuing shrinkages in geometries which tend to increase leakage. Increases in leakage decrease yield. For a given voltage, a decrease in distance across which that voltage is supported will tend to increase leakage at that voltage. The amount of leakage for a single device may be very small but that leakage may be multiplied by a very large number. This is particularly true in a memory array. Memories are now being produced with gigabits so any leakage when multiplied by the number of memory cells can be very significant. In the case of SRAMs in particular one of the issues concerning leakage arises from an efficient manner of providing a contact in which a gate of one transistor is connected to the drain of another transistor. Many such connections exist, but for efficient layout of the SRAM cell, the gate and the drain are very close together where the connection is made. This results in using what is often called a shared contact.

Figure 1:
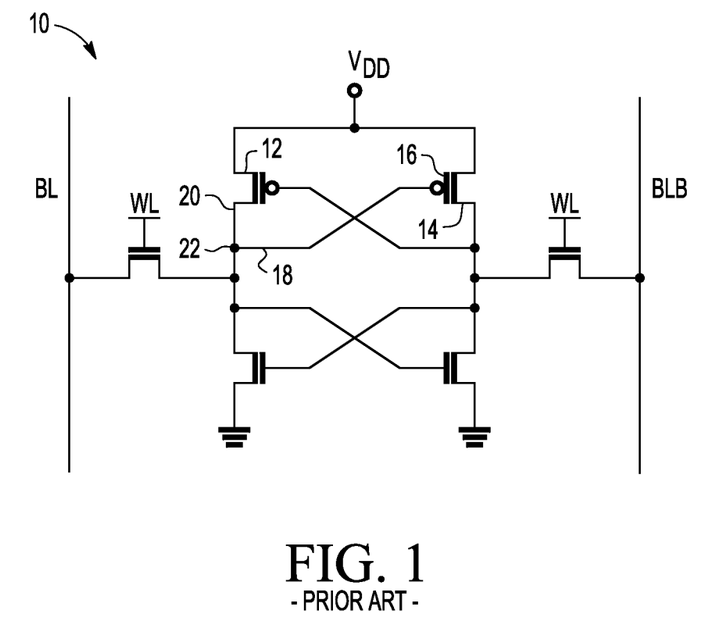
FIG. 1 is a circuit diagram of an SRAM cell according to the prior art.

Shown in FIG. 1 is a circuit diagram of a conventional SRAM cell 10 that has, among other elements, a P channel transistor with a drain 20 and a P channel transistor 14 having a gate electrode 16. A conductor 18 extends from gate electrode 16 to be connected to drain 20 with a shared contact 22. The P channels are connected symmetrically so the other P channel gate and drain are similarly connected with a shared contact. The N channels also have a similar coupling but do not generally benefit from a shared contact because the contact points are further apart, so conventional vias connected to an overlying metal layer are used.

Figure 2:
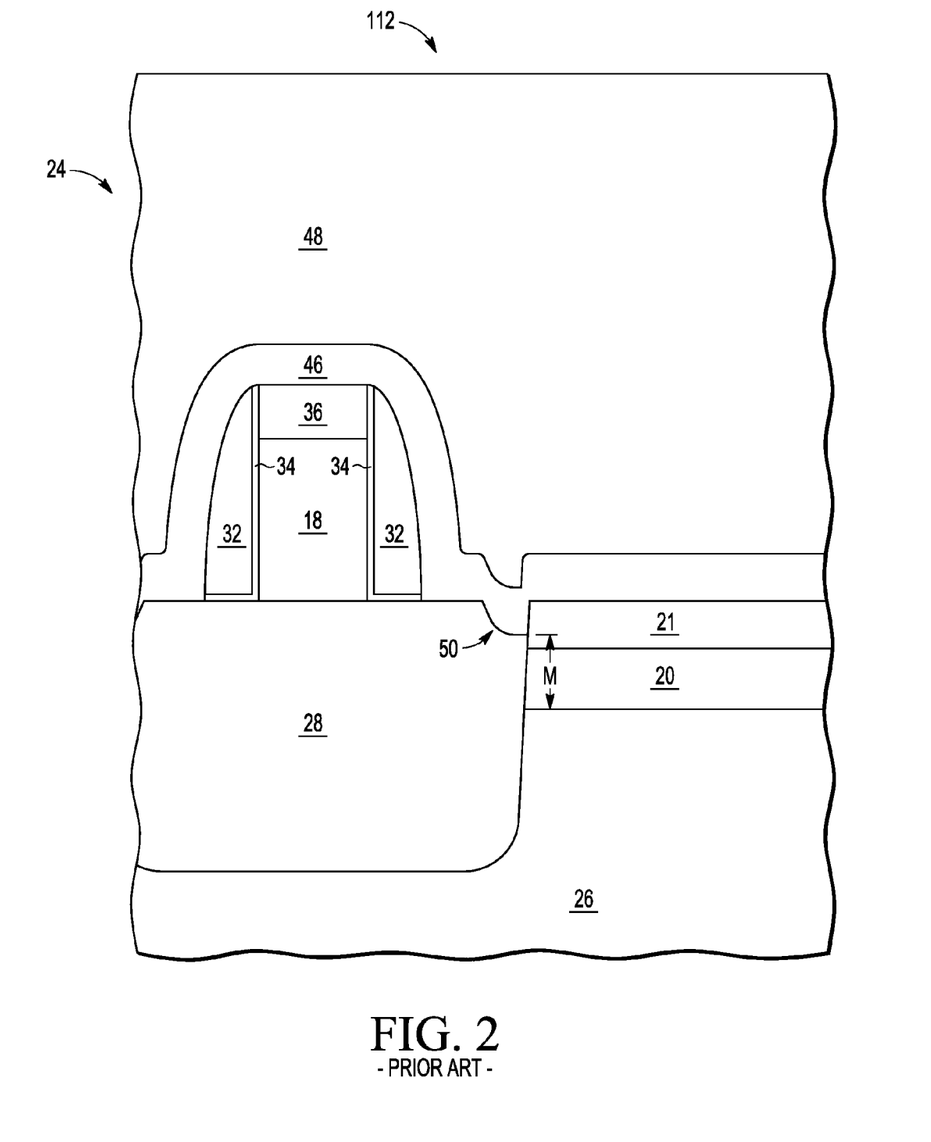
FIG. 2 is a cross section of a semiconductor device at a stage in processing according to the prior art.

Shown in FIG. 2 is a semiconductor structure 24 showing in cross section a portion of SRAM cell 10 prior to forming shared contact 22 showing gate electrode 18 and drain 20. As shown in FIG. 2, semiconductor device 24 also includes a substrate 26 that is N type, shallow trench isolation (STI) 28 formed of oxide in substrate 26, a silicide layer 21 on drain 20, a sidewall spacer 32 around gate electrode 18, a silicide layer 36 on gate electrode 18, an oxide liner 34 on the sidewalls of gate electrode 18 and under sidewall spacer 32, a nitride layer 46 over drain 20, silicide layer 36, sidewall spacer 32, and STI 28, and an oxide layer 48 over nitride layer 46. Oxide layer 48 is much thicker than nitride layer 46 and nitride layer 46 is much thicker than oxide liner 34. Silicide layer 21 is for having a low resistance contact with drain 20 and may be considered part of the drain of transistor 12 and is achieved by siliciding a portion of drain 20. Similarly, silicide layer 36 is achieved by siliciding gate electrode 18. As shown at the surface of STI 28 where STI 28 joins drain silicide 21, there is a divot 50 which is an area where nitride 46 extends into STI 28 below the level of the top surface of drain 20. Divot 50 arises due to the various etches that are performed in forming the transistors of SRAM cell 10 of FIG. 1. The functioning of the SRAM cell depends on the PN junction formed between drain 20 and substrate 26. The region shown as substrate 26 may be formed as a well that is formed as N type. The lowest portion of divot 50 is a distance M away from substrate 26. Semiconductor device 24 is at a stage in processing in which the transistors of SRAM cell have been formed but before they have been interconnected.

Figure 3:
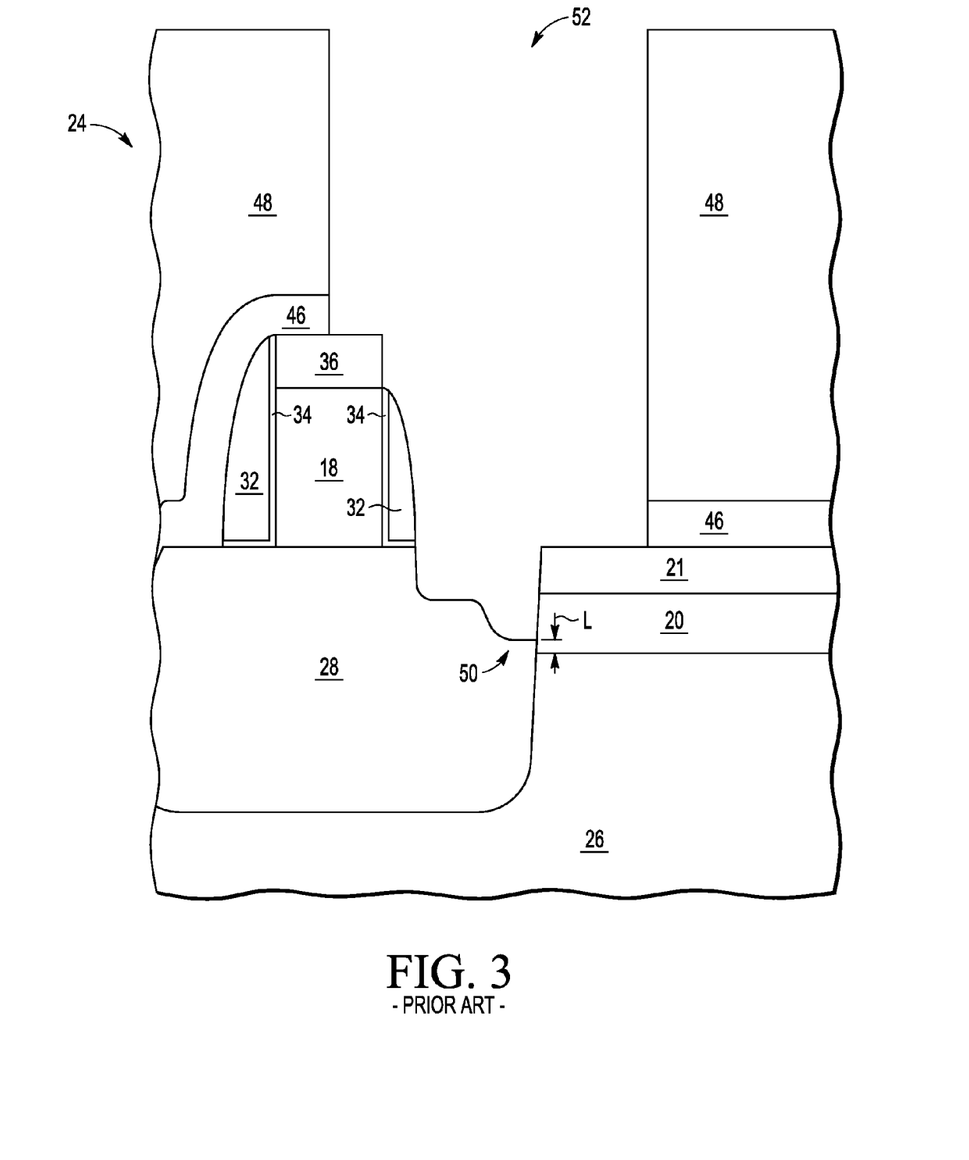
FIG. 3 is a cross section of the semiconductor device of FIG. 2 at subsequent stage in processing according to the prior art.

Shown in FIG. 3 is semiconductor device 24 after performing an etch that forms an opening 52 between drain 20 and silicide layer 36. An effect of this etch is that STI 28 is also etched resulting in divot 50 being lowered so that the lowest portion of divot 50 is only a distance L from substrate 26. Also sidewall spacer 32 is significantly reduced in size on the side that adjoins opening 52.

Figure 4:
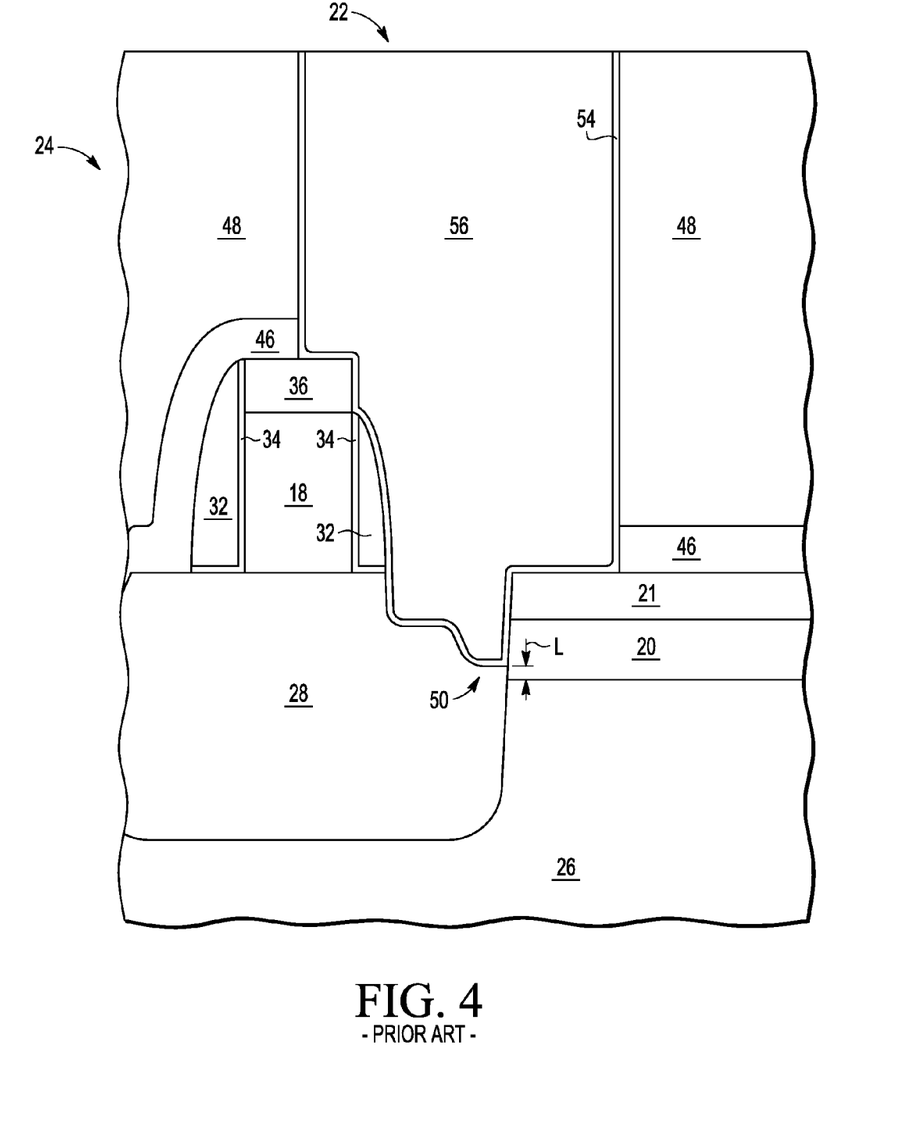
FIG. 4 is a cross section of the semiconductor device of FIG. 3 at subsequent stage in processing according to the prior art.

Shown in FIG. 4 is semiconductor device 24 after filling opening 52 with conductive material to form shared contact 22 that comprises a glue layer 54 and a conductive fill 56. Glue layer 54 may include a barrier layer, an adhesion layer, and a seed layer. Conductive fill 56 may include tungsten. This shows that contact fill 56 is only a distance L from substrate 26 and is much closer to gate electrode 18. These reduced distances tend to increase leakage. As distance L becomes smaller, the leakage increases significantly and if it reaches below the interface between drain 20 and substrate 26, the bit will fail due to bypassing the PN junction between substrate 26 and drain 20. The distance L is difficult to control precisely so this type of direct and immediate failure can occur. Also any leakage at this point degrades performance of the bit cell and can result in data retention failures.

Thus, there is a need to reduce the failures in a shared contact such as induced by the described process and resulting structure shown in FIG. 4.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A shared contact, which is particularly useful in a SRAM array, is formed by two separate etch steps through an overlying oxide layer that are performed at different times. One etch step is to a gate electrode which may be called the gate opening etch. The other etch step is to a drain which may be called the drain opening step. The result of these two etch steps is that there is a continuous opening between the drain and the gate electrode. This continuous opening is filled with conductive material so that there is a contact formed between the gate electrode and the drain. This is better understood by reference to the following specification and the drawings.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 5:
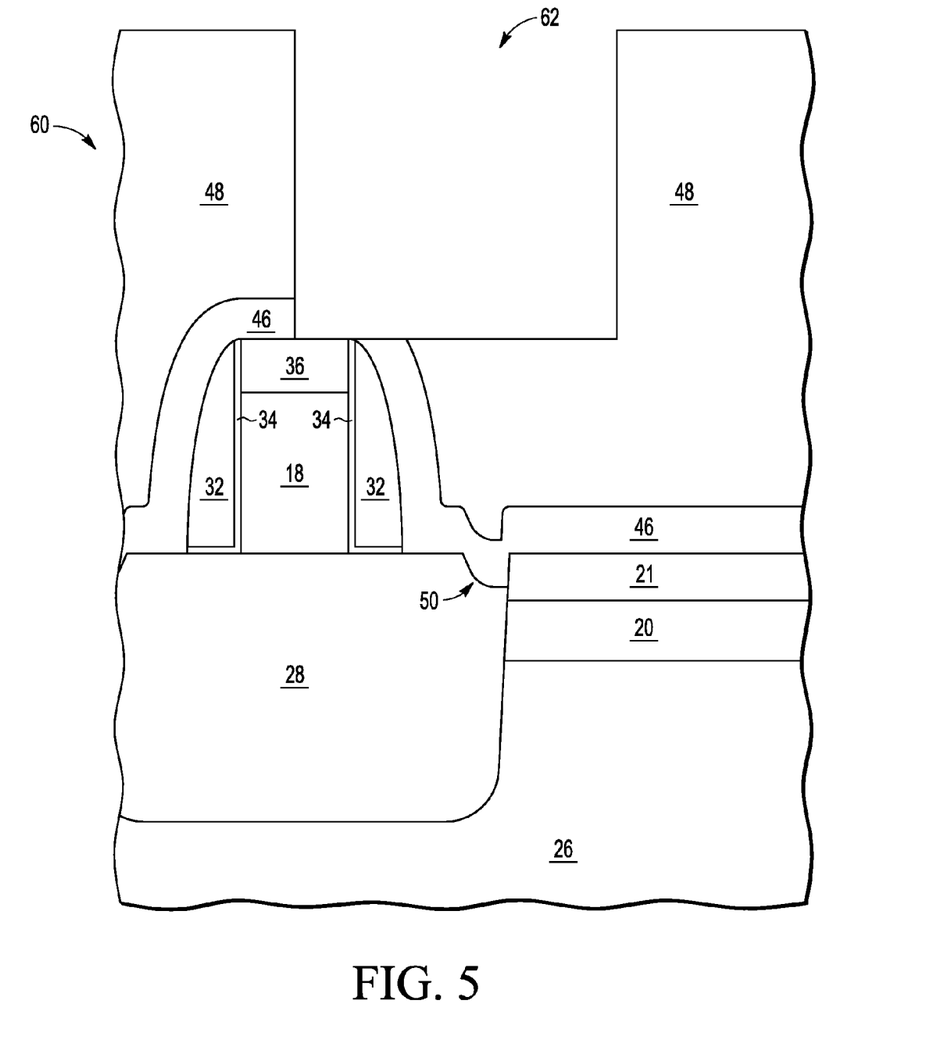
FIG. 5 is a cross section of the semiconductor device of FIG. 2 at a stage in processing according to first embodiment.

Shown in FIG. 5 is a semiconductor device 60 after performing a patterned etch on device structure 10 of FIG. 2. Opening 62 is through oxide layer 48 and nitride layer 46 over a portion of gate electrode 18 and also partially through oxide layer 48 over the region between gate electrode 18 and drain 20 and over a portion of drain 20. This etch is performed sufficiently long to ensure that silicide layer 36 is exposed to opening 62. In FIG. 5, opening 62 has one end point on the top surface of silicide layer 36. In FIG. 5 to the right of silicide layer 36, opening 62 may extend below the top surface of silicide layer 36 and into a top portion of sidewall spacer 32 and portion of nitride layer 46. This etch would at first be an oxide etch and then change to a nitride etch in order to remove nitride layer 46 that is over silicide region 36.

Figure 6:
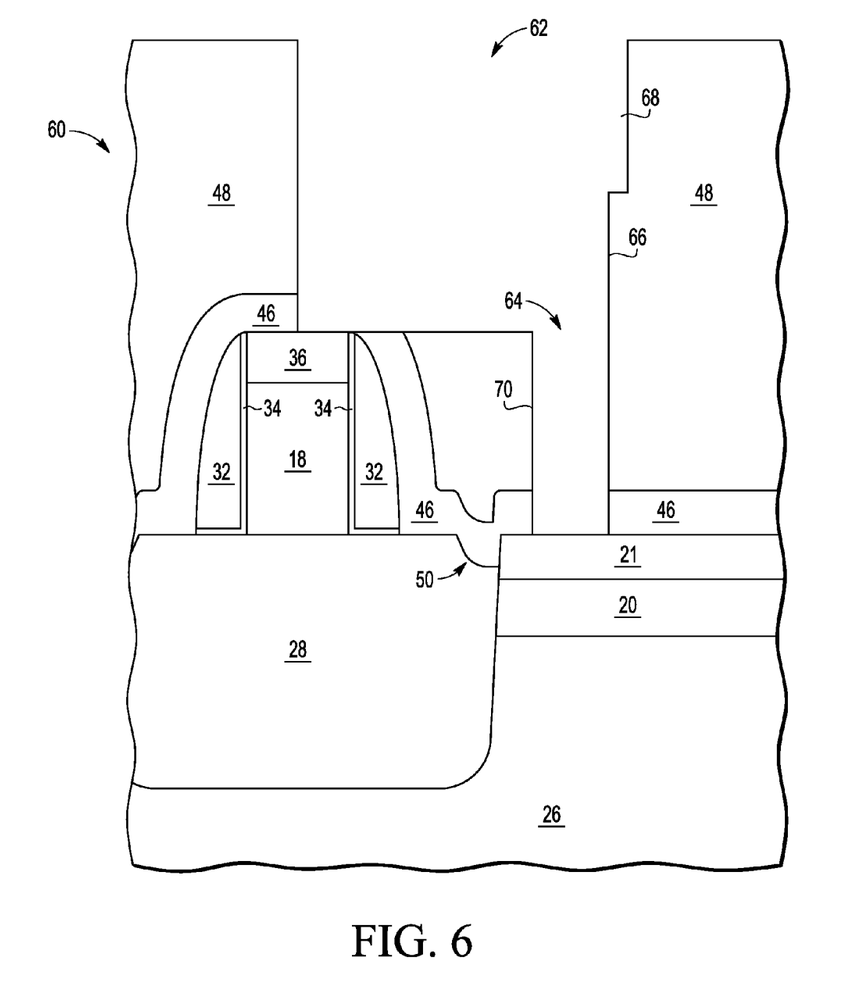
FIG. 6 is a cross section of the semiconductor device of FIG. 5 at a subsequent stage in processing.

Shown in FIG. 6 is semiconductor device 60 after a patterned etch through oxide to form an opening 64 having a left side 70 that may be called edge 70 and a right side 66 of oxide layer 48. In this example, the mask (not shown) that is used for patterning is not aligned to right side 66 that may be called edge 66 and so during the etch, an upper portion of oxide layer 48 is also etched resulting in an edge 68 offset from edge 66. Edge 70 is aligned to avoid being over STI 28. Thus divot 50 is unchanged because nitride layer 46 is not etched at divot 50. The result of forming openings 62 and 64 is that there is a continuous opening between drain 20 and silicide layer 36. Silicide layer 36 is for providing excellent electrical contact and may be considered part of the gate electrode and called gate silicide 36. Thus, the continuous opening resulting from openings 62 and 64 can be considered from the gate of one transistor to the drain of another transistor. Openings 62 and 64 are contiguous which results in this continuous opening from gate to drain.

Figure 7:
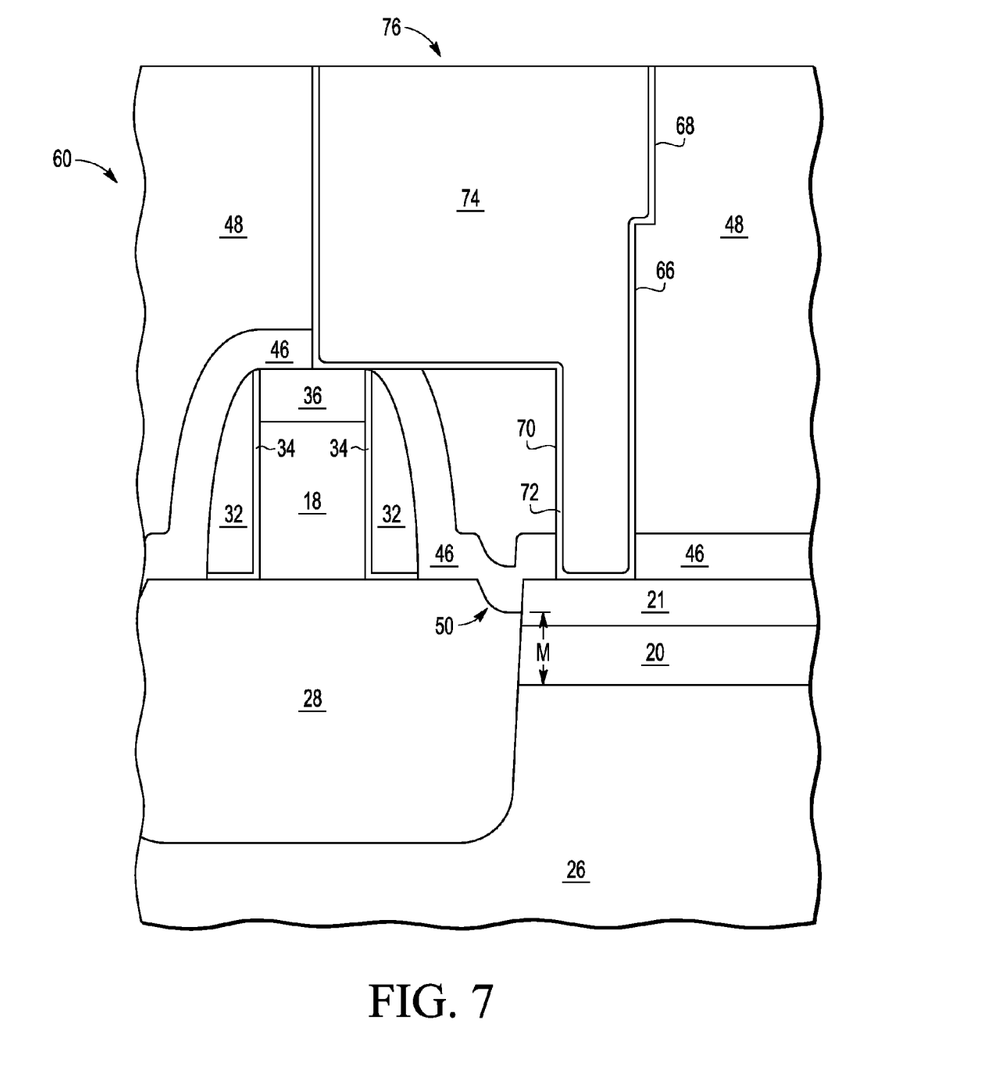
FIG. 7 is a cross section of the semiconductor device of FIG. 6 at a subsequent stage in processing.

Shown in FIG. 7 is semiconductor device 60 after filling openings 62 and 64 with conductive material comprising a glue layer 72 and a conductive fill 74. This may be done in the same way and using the same materials as for glue layer 54 and conductive fill 56 of semiconductor device 24 of FIG. 4.

Figure 8:
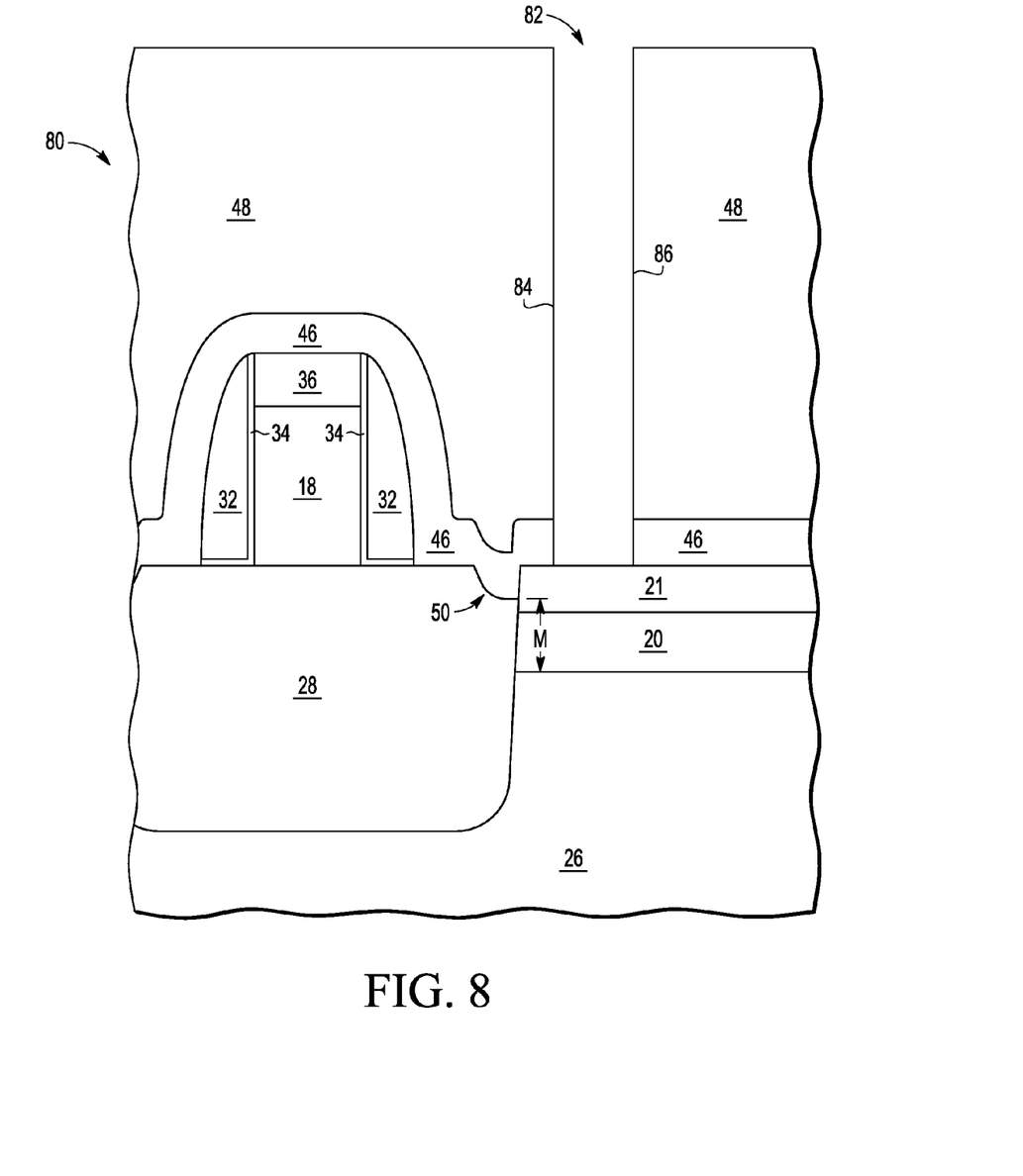
FIG. 8 is a cross section of the semiconductor device of FIG. 2 at a stage in processing according to a second embodiment.

Shown in FIG. 8 is a semiconductor device 80 after performing a patterned etch on device structure 10 of FIG. 2 as an alternative to the process described for semiconductor device 60 of FIG. 5. The patterned etch is all the way through oxide layer 48 to drain silicide 21. Opening 82 has a left side 84 that may be called edge 84 and a right side 86 that may be called edge 86. Edge 84 does not extend over STI 28 and thus not over divot 50. Divot 50 is not etched during this etch. There must be sufficient etching to ensure that drain silicide 21 is exposed.

Figure 9:
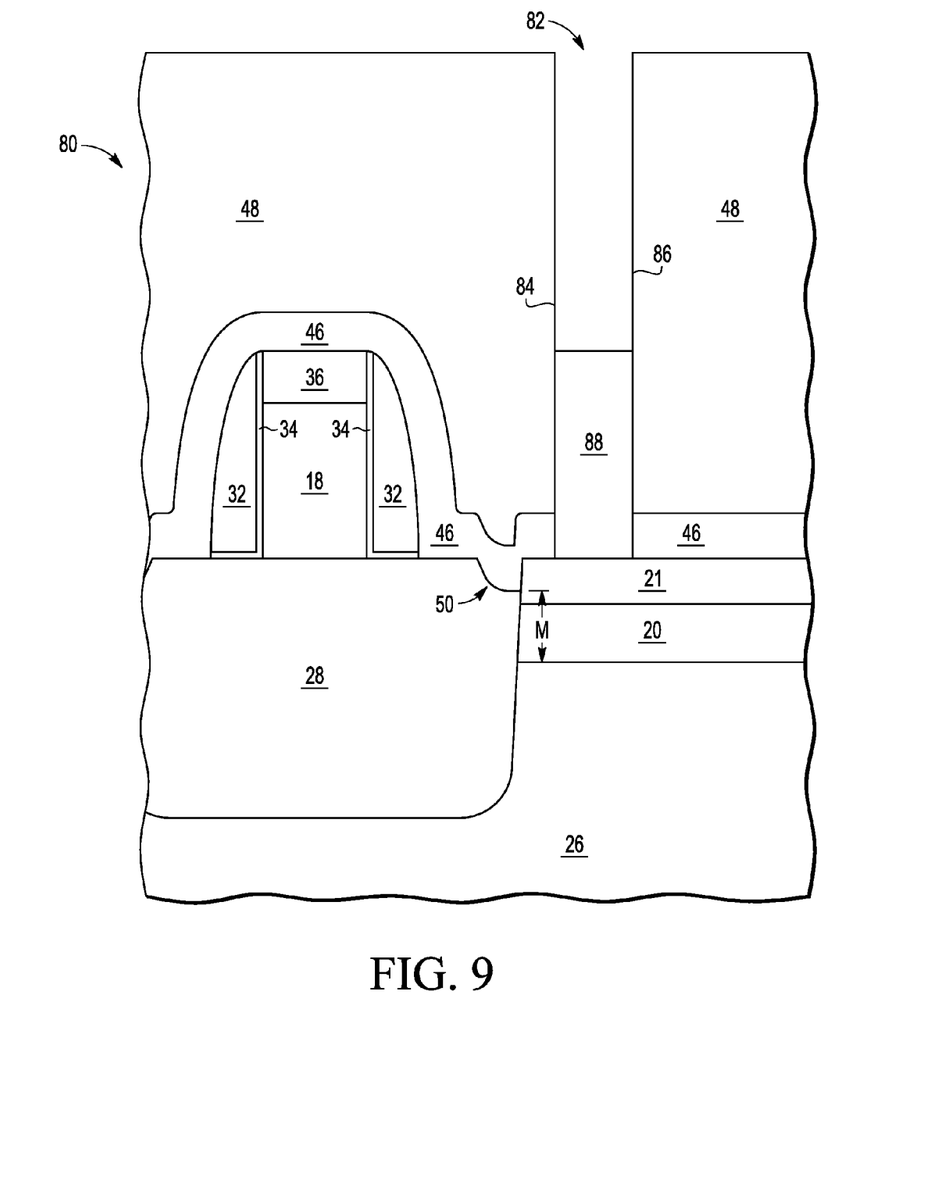
FIG. 9 is a cross section of the semiconductor device of FIG. 8 at a subsequent stage in processing.

Shown in FIG. 9 is semiconductor device 80 after partially filling opening 82 with photoresist 88. This may be achieved using a photoresist deposition and an etch back to leave the desired depth of photoresist 88 in opening 82.

Figure 10:
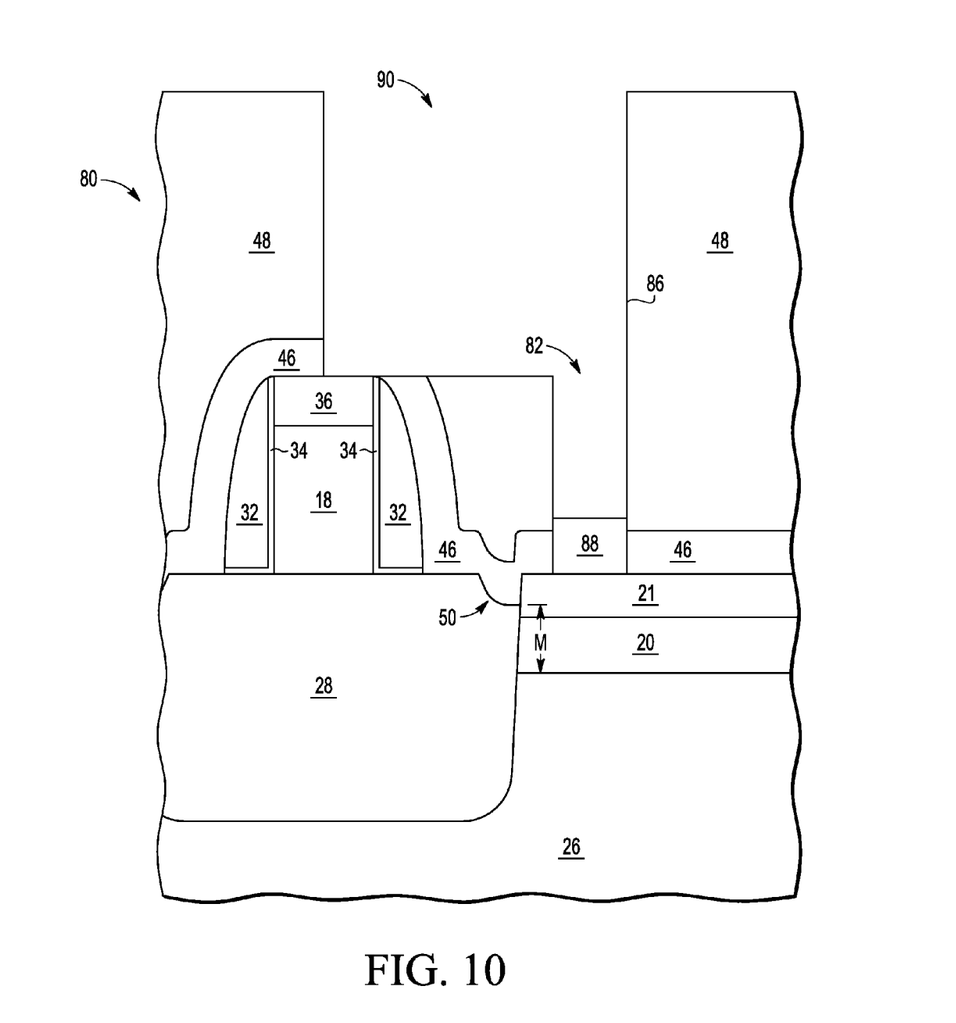
FIG. 10 is a cross section of the semiconductor device of FIG. 9 at a subsequent stage in processing.

Shown in FIG. 10 is semiconductor device 80 after performing an etch to form opening 90 over gate silicide 36 through oxide layer 48 and nitride layer 46 to expose a portion of gate silicide 36. This etch stops before extending much below the top surface of gate silicide 36. This results in a portion of photoresist 88 remaining in opening 82 and ensures that nitride layer 46 at divot 50 is not etched. Photoresist 88 is etched back some during the etch but not completely removed so as to protect drain silicide 21 from receiving the etchants used to form opening 90. This shows that openings 90 and 82 form a continuous opening between gate silicide 36 and drain silicide 21.

Figure 11:
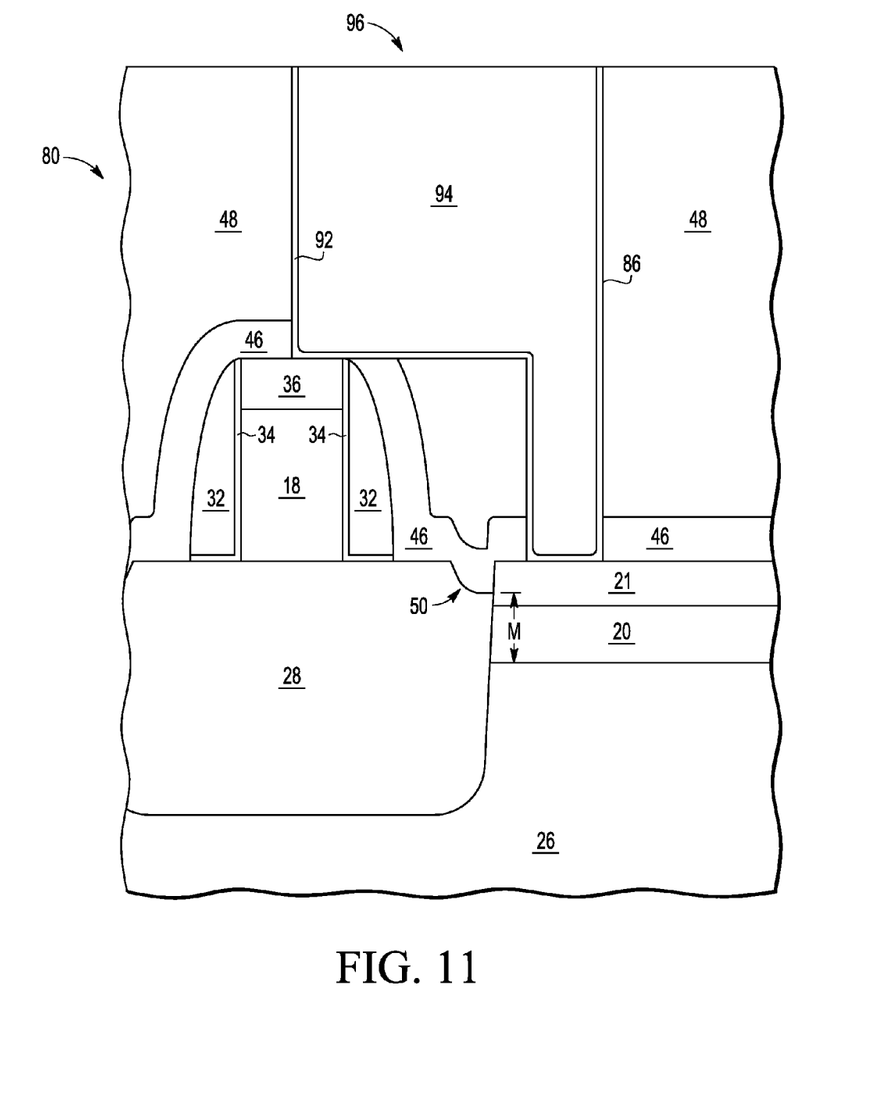
FIG. 11 is a cross section of the semiconductor device of FIG. 10 at a subsequent stage in processing.

Shown in FIG. 11 is semiconductor device 80 after completing the removal of photoresist 88 by exposing it and then filling openings 82 and 90 with conductive material comprising a glue layer 92 and a conductive fill 94 to form a shared contact 96 between drain silicide 21 and gate silicide 36. This may be done in the same way and using the same materials as for glue layer 54 and conductive fill 56 of semiconductor device 24 of FIG. 4. The resulting structure of semiconductor device 80 is essentially the same as semiconductor device 60 of FIG. 7. Both avoid the problems associated with etching divot 50 and as a consequence allow for bringing drain 20 in closer proximity to gate 18, allowing more margins for alignment of the openings 64 in FIG. 7 and 82 in FIG. 8 to drain 20.

Figure 12:
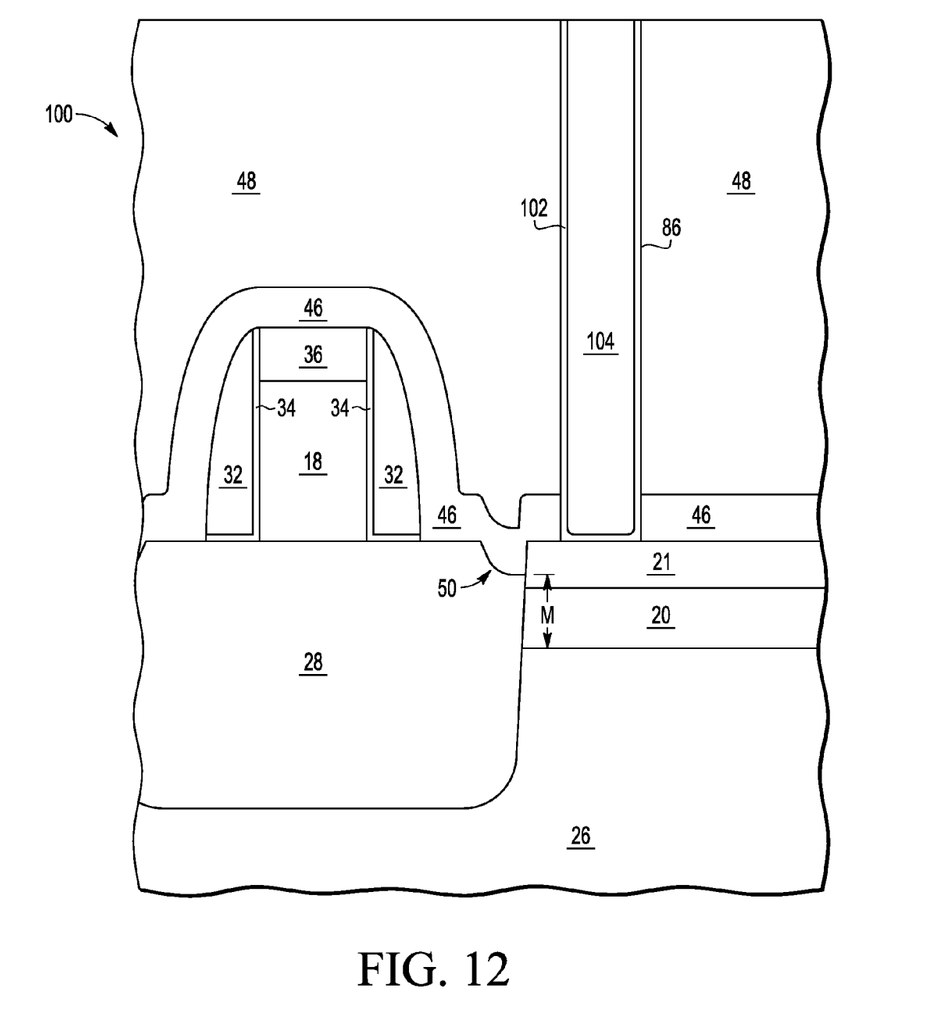
FIG. 12 is a cross section of the semiconductor device of FIG. 8 at a stage in processing according to a third embodiment.

Shown in FIG. 12 is a semiconductor device 100 after filling opening 82 of FIG. 8 with conductive material comprising glue layer 102 and conductive fill 104. This is an alternative to proceeding according to the process described for FIGS. 9-11. This conductive filling may be done in the same way and using the same materials as for glue layer 54 and conductive fill 56 of semiconductor device 24 of FIG. 4.

Figure 13:
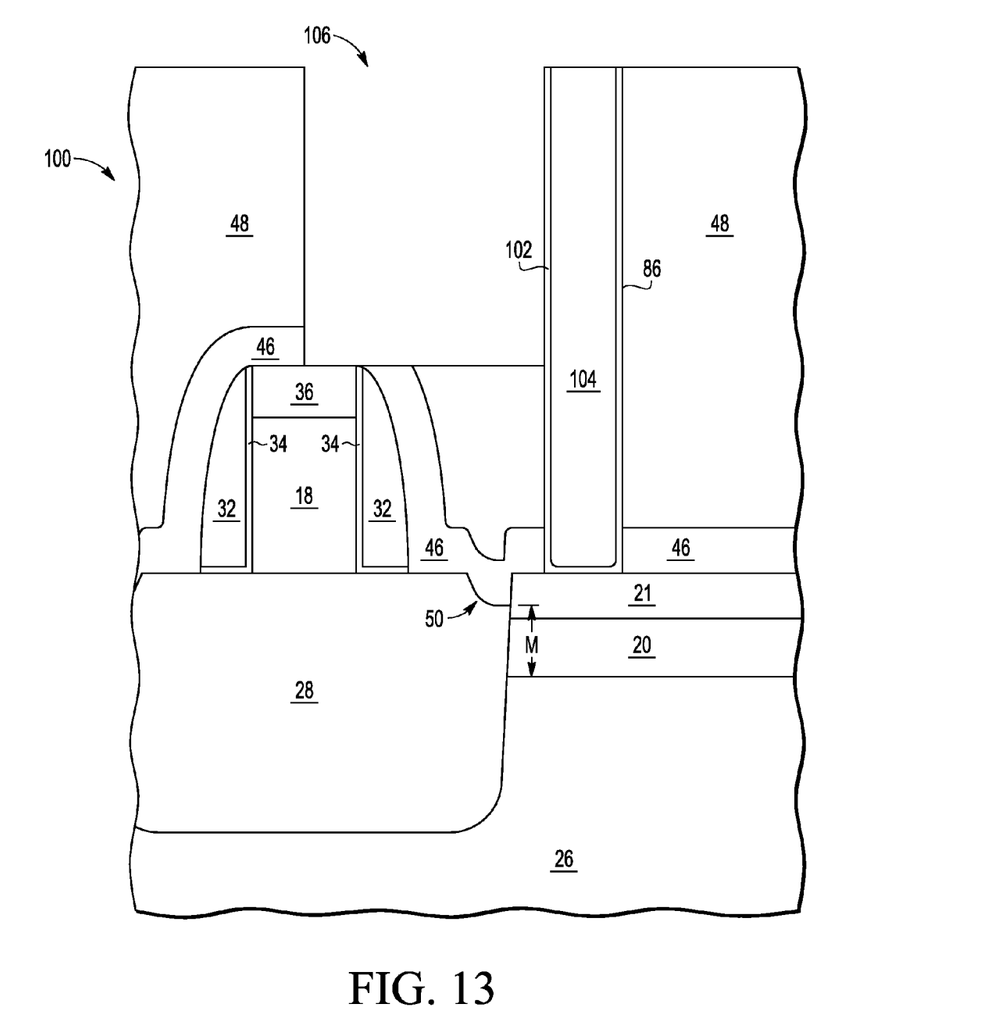
FIG. 13 is a cross section of the semiconductor device of FIG. 12 at subsequent stage in processing.

Shown in FIG. 13 is semiconductor device 100 after performing an etch through oxide layer 48 and nitride layer 46 to gate silicide 36. This leaves an opening 106 over gate silicide 36 that extends to glue layer 102 and does not extend much below the top surface of gate silicide 36 so as to ensure that nitride layer 46 at divot 50 is not etched. The etchants applied to oxide layer 48 and nitride layer 46 have minimal impact on glue layer 102 and conductive fill 104 so the alignment of the mask on the right side of the etch is simply to ensure that oxide layer 48 on the right side of conductive fill 104 is not etched.

Figure 14:
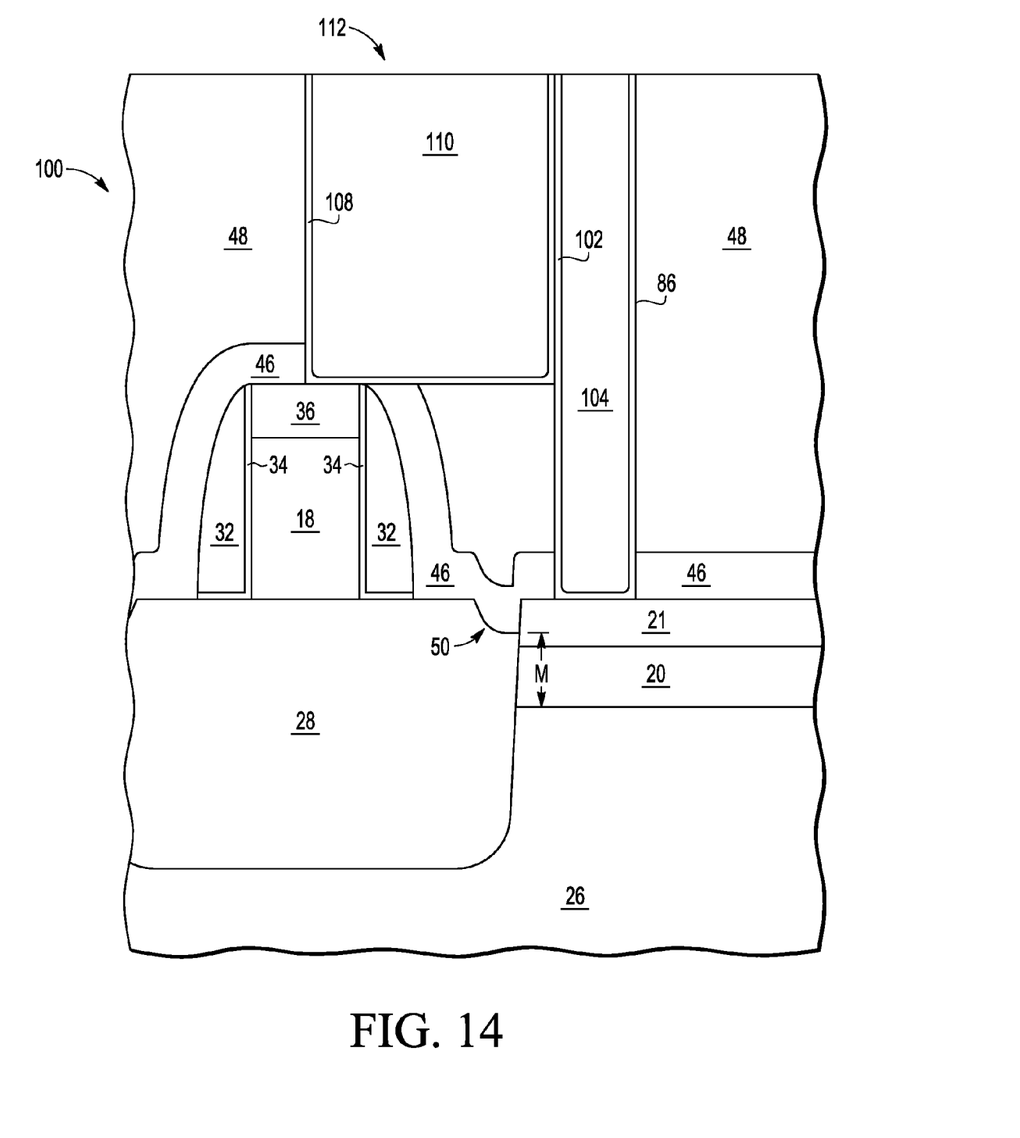
FIG. 14 is a cross section of the semiconductor device of FIG. 13 at subsequent stage in processing.

Shown in FIG. 14 is semiconductor device 100 after filling opening 86 with conductive material comprising a glue layer 108 and a conductive fill 110 which may be done in the same manner as for the other glue layers and conductive fills. This has the effect of providing contact between the drain silicide 21 and gate silicide 36. In this case openings 82 and 86 are not present at the same time but rather opening 82 is filled before opening 86 is formed. Nonetheless the locations of openings 82 and 86 are continuous so the effect of filling them is to provide contact between the drain of one transistor and gate of another. The resulting structure is similar to semiconductor device 80 of FIG. 11 and semiconductor device 60 of FIG. 7. A noticeable difference is the presence of glue layers 102 and 108 running vertically between gate silicide 36 and drain silicide 21.

Thus it is seen that the process of providing separate but contiguous openings for exposing the gate and drain results in avoiding etching divot 50 and thereby reducing leakage and risk of failures caused by excessive leakage or the shorting of the well-to-drain PN junction.

By now it should be appreciated that there has been provided A method for forming a shared contact in a semiconductor device having a gate electrode corresponding to a first transistor and a source/drain region corresponding to a second transistor, wherein the gate electrode corresponding to the first transistor and the source/drain region corresponding to the second transistor have an overlying dielectric layer. The method includes forming a first opening in the overlying dielectric layer, wherein the first opening extends substantially to the gate electrode corresponding to the first transistor. The method further includes after forming the first opening, forming a second opening, contiguous with the first opening, in the overlying dielectric layer, wherein the second opening extends substantially to the source/drain region corresponding to the second transistor. The method further includes forming the shared contact between the gate electrode corresponding to the first transistor and the source/drain region corresponding to the second transistor by filling the first opening and the second opening with a conductive material. The method may have a further characterization by which the first opening has a first width and a first depth and the second opening has a second width and a second depth, and wherein the first width is greater than the second width and the first depth is lower than the second depth. The method may further comprise prior to filling the first opening and the second opening with the conductive material, forming a glue layer in the first opening and the second opening. The method may have a further characterization by which the gate electrode comprises a first portion and a second portion, wherein the second portion is silicided, and wherein a spacer is formed adjacent to both the first portion and the second portion of the gate electrode, and wherein forming the second opening further comprises etching the overlying dielectric layer such that a minimal portion of the spacer adjacent to the first portion of the gate electrode is etched. The method may have a further characterization by which the step of forming the first opening comprises patterning and etching a first portion of the overlying dielectric layer using a first mask. The method may have a further characterization by which the step of forming the second opening comprises patterning and etching a second portion of the overlying dielectric layer using a second mask different from the first mask. The method may have a further characterization by which the semiconductor device further comprises a nitride layer formed below the overlying dielectric layer, wherein the step of patterning and etching the first portion of the overlying dielectric layer using the first mask further comprises etching a first portion of the nitride layer, and wherein the step of patterning and etching the second portion of the overlying dielectric layer using the second mask further comprises etching a second portion of the nitride layer.

Also described is a method for forming a shared contact in a semiconductor device having a source/drain region corresponding to a first transistor and a gate electrode corresponding to a second transistor, wherein the source/drain region corresponding to the first transistor and the gate electrode corresponding to the second transistor have an overlying dielectric layer. The method further includes forming a first opening in the overlying dielectric layer, wherein the first opening extends substantially to the source/drain region corresponding to the first transistor. The method further includes after forming the first opening, forming a second opening, contiguous with the first opening, in the overlying dielectric layer, wherein the second opening extends substantially to the gate electrode corresponding to the second transistor. The method further includes forming the shared contact between the source/drain region corresponding to the first transistor and the gate electrode corresponding to the second transistor by filling the first opening and the second opening with a conductive material. The method may have a further characterization by which the first opening has a first width and a first depth and the second opening has a second width and a second depth, and wherein the first width is lower than the second width and the first depth is greater than the second depth. The method may further comprise prior to filling the first opening and the second opening with the conductive material, forming a glue layer in the first opening and the second opening. The method may have a further characterization by which the gate electrode comprises a first portion and a second portion, wherein the second portion is silicided, and wherein a spacer is formed adjacent to both the first portion and the second portion of the gate electrode, and wherein forming the first opening further comprises etching the overlying dielectric layer such that a minimal portion of the spacer adjacent to the first portion of the gate electrode is etched. The method may have a further characterization by which the step of forming the first opening comprises patterning and etching a first portion of the overlying dielectric layer using a first mask. The method may have a further characterization by which the step of forming the second opening comprises patterning and etching a second portion of the overlying dielectric layer using a second mask different from the first mask. The method may have a further characterization by which the semiconductor device further comprises a nitride layer formed below the overlying dielectric layer, wherein the step of patterning and etching the first portion of the overlying dielectric layer using the first mask further comprises etching a first portion of the nitride layer, and wherein the step of patterning and etching the second portion of the overlying dielectric layer using the second mask further comprises etching a second portion of the nitride layer. The method may further comprise prior to forming the second opening, forming a photoresist layer above the overlying dielectric layer and etching the photoresist layer to leave a portion of the photoresist layer inside at least a bottom portion of the first opening.

Described also is a method for forming a shared contact in a semiconductor device having a source/drain region corresponding to a first transistor and a gate electrode corresponding to a second transistor, wherein the source/drain region corresponding to the first transistor and the gate electrode corresponding to the second transistor have an overlying dielectric layer. The method further includes forming a first opening in the overlying dielectric layer, wherein the first opening extends substantially to the source/drain region corresponding to the first transistor. The method further includes forming a first glue layer in the first opening. The method further includes after forming the first glue layer in the first opening and filling the first opening with a conductive material, forming a second opening, wherein the second opening has one side adjacent to the first glue layer, in the overlying dielectric layer, wherein the second opening extends substantially to the gate electrode corresponding to the second transistor. The method further includes forming a second glue layer in the second opening and filling the second opening with the conductive material to form the shared contact between the source/drain region of the first transistor and the gate electrode of the second transistor. The method may have a further characterization by which the first opening has a first width and a first depth and the second opening has a second width and a second depth, and wherein the first width is lower than the second width and the first depth is greater than the second depth. The method may have a further characterization by which the gate electrode comprises a first portion and a second portion, wherein the second portion is silicided, and wherein a spacer is formed adjacent to both the first portion and the second portion of the gate electrode and wherein forming the first opening further comprises etching the overlying dielectric layer such that a minimal portion of the spacer adjacent to the first portion of the gate electrode is etched. The method may have a further characterization by which the step of forming the first opening comprises patterning and etching a first portion of the overlying dielectric layer using a first mask. The method may have a further characterization by which the step of forming the second opening comprises patterning and etching a second portion of the overlying dielectric layer using a second mask different from the first mask.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the shared contact was characterized as between gate and drain but a source could also be contacted in the same, especially since sources and drains are generally made the same and distinguishable only by their function. Thus the contact may be considered to be between a gate and a source/drain. Also the embodiment described identified particular transistor as P channel or N channel. A complementary structure may be formed in which the P and N types are reversed. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a shared contact in a semiconductor device having a gate electrode corresponding to a first transistor, a source/drain region corresponding to a second transistor, and a shallow trench isolation region extending from an edge of the source/drain region closest to the gate electrode to at least under the gate electrode, wherein the gate electrode corresponding to the first transistor, the source/drain region corresponding to the second transistor, and at least a portion of the shallow trench isolation region have an overlying dielectric layer, the method comprising:
    forming a first opening in the overlying dielectric layer, wherein the first opening extends substantially to the gate electrode corresponding to the first transistor;
    after forming the first opening, forming a second opening, contiguous with the first opening, in the overlying dielectric layer, wherein
        the second opening extends substantially to the source/drain region corresponding to the second transistor, and
        the second opening is aligned to avoid being over the shallow trench isolation region; and
    forming the shared contact between the gate electrode corresponding to the first transistor and the source/drain region corresponding to the second transistor by filling the first opening and the second opening with a conductive material.

2. The method of claim 1, wherein the first opening has a first width and a first depth and the second opening has a second width and a second depth, and wherein the first width is greater than the second width and the first depth is lower than the second depth.

3. The method of claim 1 further comprising:
    prior to filling the first opening and the second opening with the conductive material, forming a glue layer in the first opening and the second opening.

4. The method of claim 1, wherein the gate electrode comprises a first portion and a second portion, wherein the second portion is silicided, and wherein a spacer is formed adjacent to both the first portion and the second portion of the gate electrode, and wherein forming the second opening further comprises:
    etching the overlying dielectric layer such that a minimal portion of the spacer adjacent to the first portion of the gate electrode is etched.

5. The method of claim 1, wherein the step of forming the first opening comprises patterning and etching a first portion of the overlying dielectric layer using a first mask.

6. The method of claim 5, wherein the step of forming the second opening comprises patterning and etching a second portion of the overlying dielectric layer using a second mask different from the first mask.

7. The method of claim 6, wherein the semiconductor device further comprises a nitride layer formed below the overlying dielectric layer, wherein the step of patterning and etching the first portion of the overlying dielectric layer using the first mask further comprises etching a first portion of the nitride layer, and wherein the step of patterning and etching the second portion of the overlying dielectric layer using the second mask further comprises etching a second portion of the nitride layer.

8. A method for forming a shared contact in a semiconductor device having a source/drain region corresponding to a first transistor, a gate electrode corresponding to a second transistor, and a shallow trench isolation region extending from an edge of the source/drain region of the first transistor closest to the gate electrode of the second transistor to at least under the gate electrode of the second transistor, wherein the source/drain region corresponding to the first transistor and the gate electrode corresponding to the second transistor have an overlying dielectric layer, the method comprising:
    forming a first opening in the overlying dielectric layer, wherein
        the first opening extends substantially to the source/drain region corresponding to the first transistor, and the first opening is aligned to avoid being over the shallow trench isolation region;

after forming the first opening, forming a second opening, contiguous with the first opening, in the overlying dielectric layer, wherein the second opening extends substantially to the gate electrode corresponding to the second transistor; and forming the shared contact between the source/drain region corresponding to the first transistor and the gate electrode corresponding to the second transistor by filling the first opening and the second opening with a conductive material.

9. The method of claim 8, wherein the first opening has a first width and a first depth and the second opening has a second width and a second depth, and wherein the first width is lower than the second width and the first depth is greater than the second depth.

10. The method of claim 8 further comprising:

prior to filling the first opening and the second opening with the conductive material, forming a glue layer in the first opening and the second opening.

11. The method of claim 8, wherein the gate electrode comprises a first portion and a second portion, wherein the second portion is silicided, and wherein a spacer is formed adjacent to both the first portion and the second portion of the gate electrode, and wherein forming the first opening further comprises:

etching the overlying dielectric layer such that a minimal portion of the spacer adjacent to the first portion of the gate electrode is etched.

12. The method of claim 8, wherein the step of forming the first opening comprises patterning and etching a first portion of the overlying dielectric layer using a first mask.

13. The method of claim 12, wherein the step of forming the second opening comprises patterning and etching a second portion of the overlying dielectric layer using a second mask different from the first mask.

14. The method of claim 13, wherein the semiconductor device further comprises a nitride layer formed below the overlying dielectric layer, wherein the step of patterning and etching the first portion of the overlying dielectric layer using the first mask further comprises etching a first portion of the nitride layer, and wherein the step of patterning and etching the second portion of the overlying dielectric layer using the second mask further comprises etching a second portion of the nitride layer.

15. The method of claim 8 further comprising: prior to forming the second opening, forming a photoresist layer above the overlying dielectric layer and etching the photoresist layer to leave a portion of the photoresist layer inside at least a bottom portion of the first opening.

16. A method for forming a shared contact in a semiconductor device having a source/drain region corresponding to a first transistor and a gate electrode corresponding to a second transistor, wherein the source/drain region corresponding to the first transistor and the gate electrode corresponding to the second transistor have an overlying dielectric layer, the method comprising:

forming a first opening in the overlying dielectric layer, wherein the first opening extends substantially to the source/drain region corresponding to the first transistor;

forming a first glue layer in the first opening;

after forming the first glue layer in the first opening and filling the first opening with a conductive material, forming a second opening, wherein the second opening has one side adjacent to the first glue layer, in the overlying dielectric layer, wherein the second opening extends substantially to the gate electrode corresponding to the second transistor; and forming a second glue layer in the second opening and filling the second opening with the conductive material to form the shared contact between the source/drain region of the first transistor and the gate electrode of the second transistor.

17. The method of claim 16, wherein the first opening has a first width and a first depth and the second opening has a second width and a second depth, and wherein the first width is lower than the second width and the first depth is greater than the second depth.

18. The method of claim 16, wherein the gate electrode comprises a first portion and a second portion, wherein the second portion is silicided, and wherein a spacer is formed adjacent to both the first portion and the second portion of the gate electrode, and wherein forming the first opening further comprises:

etching the overlying dielectric layer such that a minimal portion of the spacer adjacent to the first portion of the gate electrode is etched.

19. The method of claim 16, wherein the step of forming the first opening comprises patterning and etching a first portion of the overlying dielectric layer using a first mask.

20. The method of claim 19, wherein the step of forming the second opening comprises patterning and etching a second portion of the overlying dielectric layer using a second mask different from the first mask.

* * * * *